US007659838B2

(12) United States Patent
Nguyen et al.

(10) Patent No.: US 7,659,838 B2
(45) Date of Patent: Feb. 9, 2010

(54) DESERIALIZER CIRCUITRY FOR HIGH-SPEED SERIAL DATA RECEIVERS ON PROGRAMMABLE LOGIC DEVICE INTEGRATED CIRCUITS

(75) Inventors: Toan Thanh Nguyen, San Jose, CA (US); Thungoc Tran, San Jose, CA (US); Sergey Yuryevich Shumarayev, San Leandro, CA (US); Arch Zaliznyak, San Jose, CA (US); Tim Tri Hoang, San Jose, CA (US); Ramanand Venkata, San Francisco, CA (US); Chong Lee, San Ramon, CA (US)

(73) Assignee: Altera Corporation, San Jose, CA (US)

( * ) Notice: Subject to any disclaimer, the term of this patent is extended or adjusted under 35 U.S.C. 154(b) by 692 days.

(21) Appl. No.: 11/359,273

(22) Filed: Feb. 21, 2006

(65) Prior Publication Data

US 2007/0043991 A1 Feb. 22, 2007

Related U.S. Application Data

(60) Provisional application No. 60/705,663, filed on Aug. 3, 2005, provisional application No. 60/707,615, filed on Aug. 12, 2005.

(51) Int. Cl.
*H03M 9/00* (2006.01)
(52) U.S. Cl. .................................... 341/100; 341/101
(58) Field of Classification Search ................. 341/100, 341/101
See application file for complete search history.

(56) References Cited

U.S. PATENT DOCUMENTS

| 5,689,195 | A | 11/1997 | Cliff et al. | |
| 5,909,126 | A | 6/1999 | Cliff et al. | |
| 6,169,501 | B1 * | 1/2001 | Ryan | 341/101 |
| 6,215,326 | B1 | 4/2001 | Jefferson et al. | |
| 6,407,576 | B1 | 6/2002 | Ngai et al. | |
| 6,650,140 | B2 | 11/2003 | Lee et al. | |
| 6,696,995 | B1 * | 2/2004 | Foley et al. | 341/100 |
| 6,823,468 | B2 * | 11/2004 | Gredone et al. | 341/100 |
| 7,058,120 | B1 * | 6/2006 | Lu et al. | 375/214 |
| 2001/0033188 | A1 | 10/2001 | Aung et al. | |
| 2003/0212930 | A1 * | 11/2003 | Aung et al. | 714/700 |

FOREIGN PATENT DOCUMENTS

EP  1 482 642  12/2004

OTHER PUBLICATIONS

Kong, D. T., 2.488 Gb/s SONET multiplexer/demultiplexer with frame detection capability, IEEE Journal on Selected Areas in Communications, Jun. 1991, vol. 9, Issue: 5, On pp. 726-731.*

* cited by examiner

*Primary Examiner*—Howard Williams
(74) *Attorney, Agent, or Firm*—Ropes & Gray LLP; Robert R. Jackson

(57) ABSTRACT

Deserializer circuitry for high-speed serial data receiver circuitry on a programmable logic device ("PLD") or the like includes circuitry for converting serial data to parallel data having any of several data widths. The circuitry can also operate at any frequency in a wide range of frequencies. The circuitry is configurable/re-configurable in various respects, at least some of which configuration/re-configuration can be dynamically controlled (i.e., during user-mode operation of the PLD).

18 Claims, 2 Drawing Sheets

DESERIALIZER CIRCUITRY FOR HIGH-SPEED SERIAL DATA RECEIVERS ON PROGRAMMABLE LOGIC DEVICE INTEGRATED CIRCUITS

BACKGROUND OF THE INVENTION

This application claims the benefit of U.S. provisional patent application No. 60/705,663, filed Aug. 3, 2005, and U.S. provisional patent application No. 60/707,615, filed Aug. 12, 2005, both of which are hereby incorporated by reference herein in their entireties.

BACKGROUND OF THE INVENTION

This invention relates to programmable logic devices ("PLDs") and other integrated circuits of that general type (all generically referred to for convenience as PLDs). More particularly, the invention relates to high-speed serial data receiver circuitry for inclusion on PLDs.

PLDs are intended to be relatively general-purpose devices. A PLD can be programmed (configured) and/or otherwise controlled to meet any need within the range of needs that the PLD is designed to support. A PLD may be equipped with high-speed serial data communication circuitry, whereby the PLD can transmit serial data to and/or receive serial data from circuitry that is external to the PLD. In that case, it is desirable for the high-speed serial data communication circuitry of the PLD to be able to support various communication protocols that various users of the PLD product may wish to employ.

In the case of high-speed serial data receiver circuitry on a PLD, one of the tasks that such circuitry typically needs to perform is deserialization of data from the serial form in which it is typically received from a source external to the PLD to the parallel form in which the receiver circuitry preferably hands the data off to other circuitry of the PLD (e.g., the core logic circuitry of the PLD). This invention provides deserializer circuitry that can perform this task for a number of different communication protocols and over a wide range of possible data rates. An illustrative range of data rates that circuitry in accordance with the invention can support is 622 Mbps (mega-bits per second) to 6.5 Gpbs (giga-bits per second). This range is only an example, however, and it will be understood that other embodiments of the invention can support other data rate ranges if desired.

SUMMARY OF THE INVENTION

In accordance with the invention, high-speed serial data receiver circuitry on a PLD includes deserializer circuitry that can convert serial data to parallel data having any of several different data widths. For example, the deserializer may be able to convert serial data to parallel data that is presented 8 bits at a time, 10 bits at a time, 16 bits at a time, or 20 bits at a time. The deserializer circuitry is also preferably able to operate at any frequencies and/or data rates in a fairly wide range. The circuitry is preferably configurable and re-configurable in various respects, which may include dynamic configuration/re-configuration (i.e., during user-mode operation of the PLD).

Further features of the invention, its nature and various advantages, will be more apparent from the accompanying drawings and the following detailed description.

DETAILED DESCRIPTION

Figure 1:
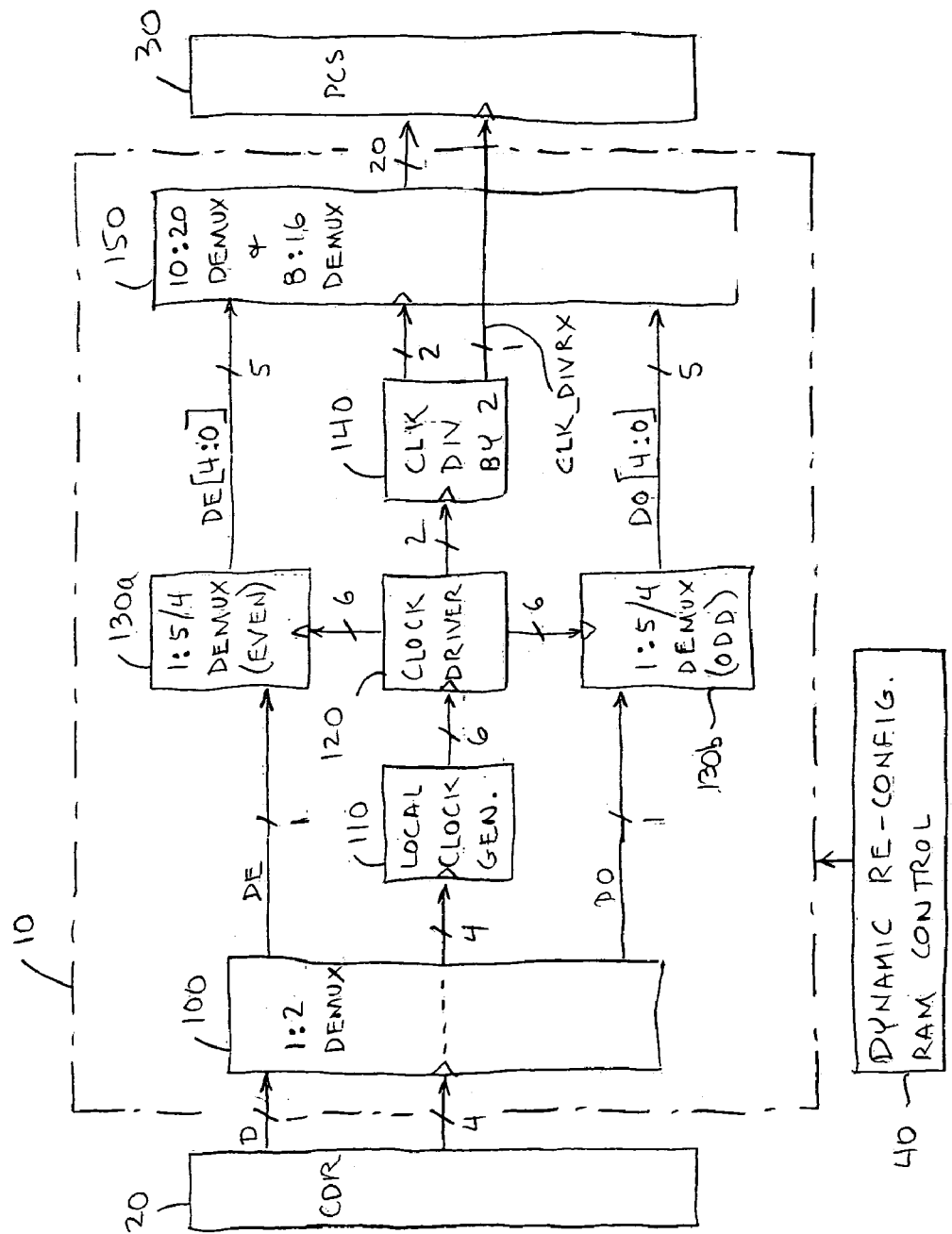
FIG. 1 is a simplified schematic block diagram of an illustrative embodiment of circuitry constructed in accordance with the invention.

An illustrative embodiment of data deserializer circuitry 10 constructed in accordance with the invention is shown in FIG. 1. By way of an introductory over-view, everything shown in FIG. 1 is part of the circuitry of a PLD. Deserializer 10 receives serial data from clock and data recovery ("CDR") circuitry 20 of the PLD, and it applies that data in parallel form to physical coding sub-layer ("PCS") circuitry 30 of the PLD. Various aspects of the operation of deserializer 10 may be controlled by output signals of dynamic random access memory ("RAM") circuitry 40 on the PLD.

In the illustrative embodiment shown in FIG. 1, deserializer 10 can handle serial data output by CDR 20 at any data rate in a wide range of such rates, and it can deserialize that data to any of several different parallel data widths. For example, the serial bit rate from CDR 20 can be any rate in the range from about 622 Mbps to about 6.5 Gbps, and the width of the parallel data output by deserializer 10 can be 8 bits, 10 bits, 16 bits, or 20 bits. This flexibility allows the circuitry to support any of a number of different communication standards or protocols.

CDR circuitry 20 typically receives the serial data signal that it operates on from a source that is external to the PLD. CDR circuitry 20 recovers from that serial data signal a so-called re-timed data signal D and a so-called recovered clock signal that is synchronized with the re-timed data signal. Re-timed data signal D is a serial data signal that CDR circuitry 20 applies to deserializer 10. CDR circuitry 20 also applies to deserializer 10 the recovered clock signal with four different phases, i.e., 0°, 90°, 180°, and 270°. As will become more apparent as the discussion proceeds, the illustrative embodiment being discussed includes half-rate capability, which can clock serial data on both edges of a clock signal. For example if CDR 20 is outputting re-timed serial data D at 6.25 Gbps, it may output recovered clock signals at 3.125 GHz. One of the purposes of the multi-phase recovered clock outputs of CDR 20 is to provide multiple versions of a half-rate clock signal that can be used in the processing of data having a serial bit rate that is twice the recovered clock signal frequency.

Within deserializer 10, re-timed serial data signal D and the recovered clock signals are applied to 1:2 demultiplexer ("demux") circuitry 100. Circuitry 100 captures (registers) each two successive serial data bits D output by CDR 20 and applies each of those bits to a respective one of circuits 130a and 130b. In particular, each bit in an "even" numbered bit position in serial data stream D is applied by circuitry 100 to circuitry 130a, and each bit in an "odd" numbered bit position in serial data stream D is applied by circuitry 100 to circuitry 130b. As an illustration of how the several recovered clock signal phases may be used, circuitry 100 may include one register that accepts data from CDR 20 on the rising edge of the 0°-phase recovered clock signal, and a second register that accepts data from CDR 20 on the rising edge of the 180°-phase recovered clock signal. The 0°-phase data may be from even bit positions; the 180°-phase data may be from odd bit positions. In this way data from two successive serial bit positions may be parallelized to two output registers of demux circuitry 100 during each cycle of the recovered half-rate clock signal.

The multi-phase recovered clock signals output by CDR circuitry 20 are also applied to local clock generator circuitry 110. Circuitry 110 uses the recovered clock signals it receives to generate several other clock signals that are needed in further deserialization operations of deserializer 10. In the embodiment of FIG. 1, circuitry 110 is shown producing as many as six different output clock signals CLK[5:0].

The output signals of circuitry 110 are applied to clock driver circuitry 120, which drives and balances the central clocks for the deserializer.

The output signals of circuitry 110 (and therefore of circuitry 120) can include relatively low frequency clock ("LFCLK") signals, e.g., at one-quarter or one-fifth the recovered clock signal frequency. The reason for this will become apparent as the discussion proceeds. At this point, however, it is appropriate to mention that whether circuitry 110 divides the recovered clock signal frequency by 4 or 5 to produce the LFCLK signals is one of the selectably variable functions of deserializer 10 that can be controlled by dynamic re-configuration RAM control circuitry 40.

As mentioned earlier, the bits ("DE") from even-numbered bit positions of the re-timed serial data are applied by demux circuitry 100 to 1:5/4 demux circuitry 130a, and the bits ("DO") from odd-numbered bit positions are similarly applied to 1:5/4 demux circuitry 130b. Each of circuits 130 accumulates four or five bits that are applied to it successively and then outputs those four or five bits in parallel. The four-bit accumulation mode of circuitries 130 is used when deserializer 10 is supplying data to PCS 30 in 8-bit or 16-bit groups (8-bit mode or 16-bit mode). The five-bit accumulation mode of circuitries 130 is used when deserializer 10 is supplying data to PCS 30 in 10-bit or 20-bit groups (10-bit mode or 20-bit mode).

As an example of possible construction and operation of circuitries 130, each of these circuitries may include five input registers that are respectively clocked by five phase-distributed LFCLK signals from circuitry 120. (In 8-bit mode and 16-bit mode the fifth register is not used, and the phase distribution omits the fifth version of the clock signal. The LFCLK frequency in these cases is the recovered clock frequency divided by 4. When all five input registers of circuitries 130 are used, the LFCLK frequency is the recovered clock frequency divided by 5.) The DE signal is applied to the input registers of circuitry 130a. The DO signal is applied to the input registers of circuitry 130b. Each time the input registers of each of these circuitries has registered four or five bits, those bits are transferred in parallel to an output register of that circuitry. From this description it will be seen that the six output signals of circuitry 120 that are applied to circuitries 130 can be up to five phase-distributed signals for clocking the up to five input registers of those circuitries, and a sixth signal for clocking the output registers of those circuitries.

The parallel output signals of demux 130a are applied to even-numbered bit positions of an input register of 10:20 demux and 8:16 demux circuitry 150. The parallel data output signals of demux 130b are applied to odd-numbered bit positions of an input register of circuitry 150. In 10- and 20-bit mode, all ten bits of that input register are used. In 8- and 16-bit mode, only eight bits of that input register are used.

Two clock signals output by circuitry 120 are applied to divide by 2 circuitry 140. Circuitry 140 selectively divides the frequency of signals it receives by two, depending on whether or not deserializer 10 is operating in one of its wider parallel data output modes (i.e., 16-bit mode or 20-bit mode). If so, circuitry 140 divides frequency by 2. If not, circuitry 140 does not divide frequency by 2. Whether or not circuitry 140 divides frequency by 2 is another selectably variable function of deserializer 10 that can be controlled by dynamic re-configuration RAM control circuitry 40. Output signals of circuitry 140 are applied to demux 150 and also to PCS 30.

In 8-bit mode and 10-mode, circuitry 150 passes its input register data on to an output register. This output register may include 20 bit positions, but only eight or ten of those bit positions will be used in 8- or 10-bit mode. In 16-bit mode and 20-bit mode, circuitry 150 may pass successive data from its input register on to alternate 10-bit portions of its 20-bit output register. In this way circuitry 150 can deserialize successive 8- or 10-bit bytes into parallel words of 16 or 20 bits in the output register of circuitry 150. Whether circuitry 150 operates in single-width mode (8 or 10 parallel output bits) or double-width mode (16 or 20 parallel output bits) is another selectively variable function of deserializer 10 that can be controlled by dynamic re-configuration RAM control circuitry 40.

PCS 30 receives data from the output register of circuitry 150 on the rising edge of the CLK_DIVRX signal from circuitry 140. As will be apparent from the foregoing discussion, this will be parallel data having a width of 8 bits, 10 bits, 16 bits, or 20 bits, depending on the operating mode of deserializer circuitry 10.

Figure 2:
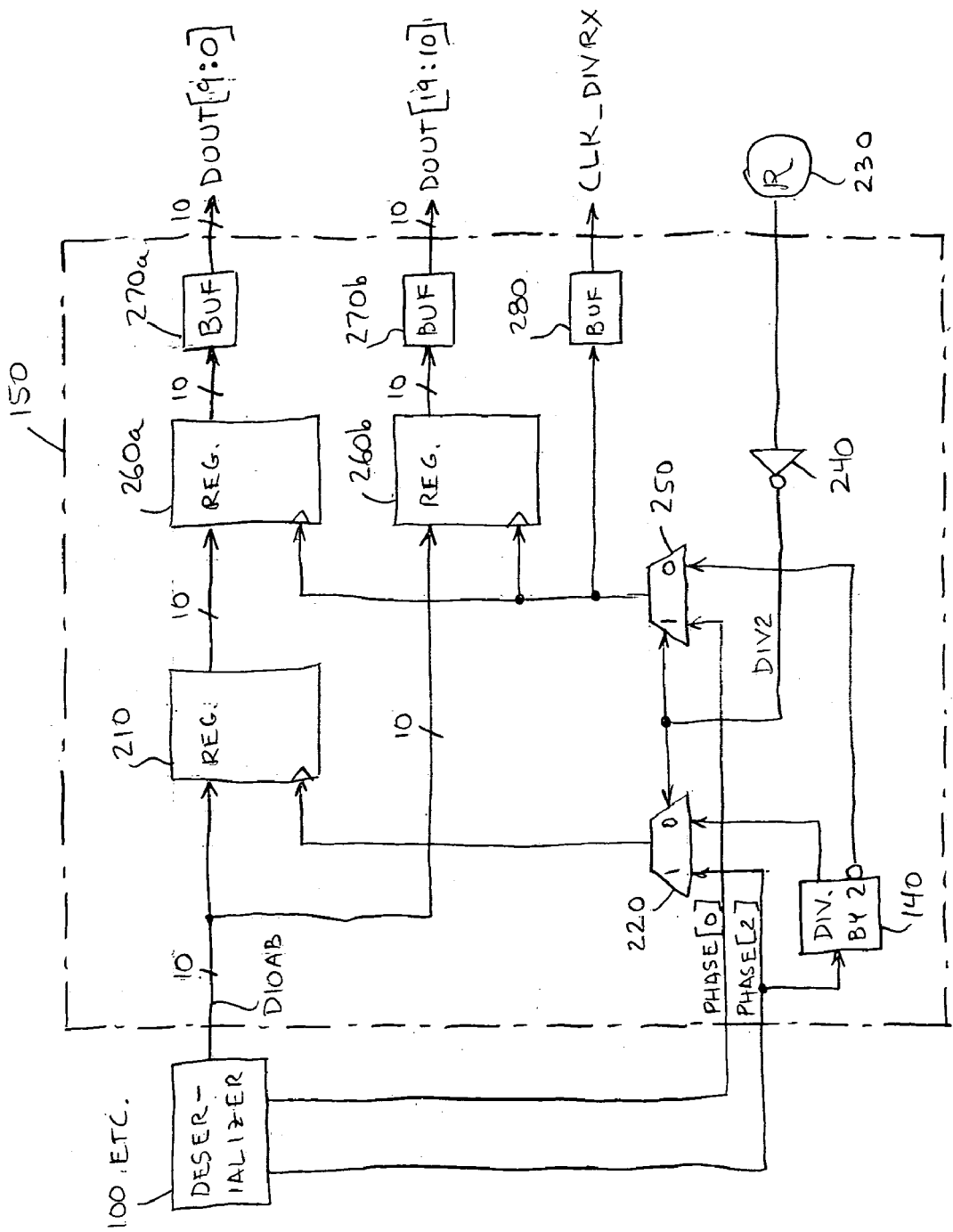
FIG. 2 is a simplified schematic block diagram of an illustrative embodiment of certain aspects of FIG. 1 in somewhat more detail in accordance with the invention.

An illustrative embodiment of byte deserializer circuitry 150 is shown in more detail in FIG. 2. In FIG. 2 the circuitry from FIG. 1 that is upstream from circuitry 150 is labeled 100 ETC. This circuitry (100 ETC.) supplies up to ten bits of parallel data (labeled D10AB in FIG. 2) to circuitry 150. This circuitry also supplies two clock signals (labeled PHASE[0] and PHASE[2]) in FIG. 2) to circuitry 150. These clock signals are 180° out of phase with one another, and they are both at the frequency at which circuitry 100 ETC. outputs successive bytes of parallel data (8 or 10 bits).

Within circuitry 150, the data output by circuitry 100 ETC. is applied to register 210 and register 260b. The PHASE[2] signal is applied to one selectable input terminal of multiplexer ("mux") 220, and also to divide by 2 circuitry 140. The PHASE[0] signal is applied to one selectable input of mux 250. Circuitry 140 divides the frequency of the signal it receives by 2 and applies true and complement versions of the resulting signal to the second selectable inputs of muxes 220 and 250, respectively.

Each of muxes 220 and 250 is controlled to select which of its selectable inputs it will output by the signal from memory bit 230 via inverter 240. Bit 230 can be a memory bit in dynamic re-configuration RAM control circuitry 40. If the circuitry is operating in 8-bit mode or 10-bit mode, then the output signal of inverter 240 causes muxes 220 and 250 to output the PHASE[2] and PHASE[0] signals, respectively. If the circuitry is operating in 16-bit mode or 20-bit mode, then the output signal of inverter 240 causes muxes 220 and 250 to respectively output the true and complement output signals of circuitry 140.

The output signal of mux 220 is used to clock register 210. The output signal of mux 250 is used to clock registers 260a and 260b. Register 260a gets its inputs from the outputs of register 210. The outputs of registers 260a and 260b are applied in parallel to PCS 30 via buffers 270a and 270b. The output signal of mux 250 is also applied to PCS 30 via buffer 280.

From the foregoing it will be seen that in 8-bit mode and 10-bit mode data from circuitry 100 ETC. is clocked through registers 210 and 260a using the PHASE[2] and PHASE[0] signals, which have frequency equal to the rate at which circuitry 100 ETC. outputs successive data. Circuit elements 140 and 260b are effectively unused. The output signal of buffer 280 is appropriate for clocking the data from register 260a into PCS 30. In 16-bit mode and 20-bit mode, on the other hand, registers 210 and 260b are clocked alternately at half the rate that circuitry 100 ETC. outputs successive data. Accordingly, registers 210 and 260b alternately store successive data outputs of circuitry 100 ETC. Also in 16-bit mode and 20-bit mode, because register 260a is clocked in parallel with register 260b, as register 260b is taking in new data from circuitry 100 ETC., register 260a is taking in the previous data from circuitry 100 ETC, which data was previously taken in and is now being output by register 210. Accordingly, the outputs of registers 260a and 260b are two parallel 8- or 10-bit bytes that were output in succession by circuitry 100 ETC. Once again, the output signal of buffer 280 is appropriate for clocking this data into PCS 30.

It will be understood that the foregoing is only illustrative of the principles of the invention, and that various modifications can be made by those skilled in the art without departing from the scope and spirit of the invention. For example, the particular operating frequencies mentioned above are only illustrative, and other frequencies can be used instead if desired.

The invention claimed is:

1. Deserializer circuitry comprising:
CDR circuitry for producing a re-timed serial data signal and a plurality of versions of a recovered clock signal, the recovered clock signal having half the frequency of the re-timed serial data signal, and the versions including first and second versions that are approximately 180° out of phase with one another;
first register circuitry responsive to the first version for capturing bits of the re-timed data signal that are in even-numbered bit positions; and
second register circuitry responsive to the second version for capturing bits of the re-timed data signal that are in odd-numbered bit positions.

2. The circuitry defined in claim 1 further comprising:
first deserializer circuitry for deserializing a selectable number of successive bits captured by the first register circuitry; and
second deserializer circuitry for deserializing the selectable number of successive bits captured by the second register circuitry.

3. The circuitry defined in claim 2 wherein the selectable number comprises four or five bits.

4. The circuitry defined in claim 2 further comprising:
circuitry for interleaving bits deserialized by the first and second deserializer circuitries in order to restore those bits to their original even-numbered and odd-numbered bit positions in interleaved data.

5. The circuitry defined in claim 4 further comprising:
circuitry for selectively deserializing two successive groups of the interleaved data, the circuitry for selectively deserializing including:
first and second data group register circuits connected to the circuitry for interleaving and having outputs that are parallel to one another, each of the first and second data group register circuits being able to register and output, in parallel, one of the groups of the interleaved data; and
clock circuitry for applying to said first data group register circuit a first clock signal having a frequency that is a controllably selectable one of (a) a rate at which the circuitry for interleaving outputs successive groups of the interleaved data, and (b) half of said rate, and for applying to said second data group register circuit a second clock signal that is 180° out of phase with said first clock signal.

6. The circuitry defined in claim 5 further comprising:
dynamic reconfiguration memory circuitry for controlling which selectable one the clock circuitry selects.

7. The circuitry defined in claim 2 further comprising:
dynamic reconfiguration memory circuitry for controlling the selectable number.

8. Deserializer circuitry comprising:
CDR circuitry for producing a re-timed serial data signal and a recovered clock signal having a frequency that is one-half the bit rate of the re-timed serial data signal;
frequency dividing circuitry for dividing the frequency of the recovered clock signal by a selectable factor to produce a relatively low frequency clock signal; and
circuitry for using the low frequency clock signal to deserialize the re-timed data signal.

9. The circuitry defined in claim 8 further comprising:
dynamic reconfiguration memory circuitry for controlling the selectable factor.

10. The circuitry defined in claim 9 wherein the selectable factor can be selected to be either four or five.

11. Deserializer circuitry comprising:
CDR circuitry for producing a re-timed serial data signal and a recovered clock signal, the recovered clock signal having a frequency that is one-half the bit rate of the re-timed serial data signal;
first deserializer circuitry for using the recovered clock signal to deserialize the re-timed data signal to parallel first and second data signals without employing any clock signal having a frequency higher than that of the recovered clock signal;
second deserializer circuitry for deserializing the first data signal to a first plurality of parallel data signals; and
third deserializer circuitry for deserializing the second data signal to a second plurality of parallel data signals.

12. The circuitry defined in claim 11 further comprising:
interleaving circuitry for interleaving signals in the first and second pluralities to produce a third plurality of parallel data signals.

13. The circuitry defined in claim 12 further comprising:
fourth deserializer circuitry for selectively deserializing successive third plurality signals to produce a fourth plurality of parallel data signals, said fourth deserializer circuitry being alternatively operable to not deserialize the successive third plurality signals.

14. The circuitry defined in claim 13 further comprising:
dynamic reconfiguration memory circuitry for controlling the fourth deserializer circuitry.

15. The circuitry defined in claim 11 wherein each of the second and third deserializer circuitries is controllable with respect to size of the first and second pluralities.

16. The circuitry defined in claim 15 further comprising:
dynamic reconfiguration memory circuitry for controlling the second and third deserializer circuitries.

17. The circuitry defined in claim 11 further comprising:
frequency divider circuitry for dividing frequency of the recovered clock signal by a selectable factor to produce a lower frequency signal for use by the second and third deserializer circuitries.

18. The circuitry defined in claim 17 further comprising:
dynamic reconfiguration memory circuitry for controlling the selectable factor.

\* \* \* \* \*

UNITED STATES PATENT AND TRADEMARK OFFICE
CERTIFICATE OF CORRECTION

PATENT NO. : 7,659,838 B2 Page 1 of 1
APPLICATION NO. : 11/359273
DATED : February 9, 2010
INVENTOR(S) : Nguyen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1025 days.

Signed and Sealed this

Twenty-eighth Day of December, 2010

David J. Kappos
*Director of the United States Patent and Trademark Office*